(12) United States Patent
Lai et al.

(10) Patent No.: US 10,756,128 B2
(45) Date of Patent: Aug. 25, 2020

(54) INTEGRATED CIRCUIT DEVICE AND METHOD OF FABRICATING INTEGRATED CIRCUIT

(71) Applicant: UNITED MICROELECTRONICS CORP., Hsin-Chu (TW)

(72) Inventors: Kuo-Chih Lai, Tainan (TW); Shih-Min Chou, Tainan (TW); Ko-Wei Lin, Taichung (TW); Chin-Fu Lin, Tainan (TW); Wei-Chuan Tsai, Changhua County (TW); Chun-Yao Yang, Kaohsiung (TW); Chia-Fu Cheng, Taipei (TW); Yi-Syun Chou, Taipei (TW); Wei Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/244,109

(22) Filed: Jan. 10, 2019

(65) Prior Publication Data
US 2020/0212090 A1   Jul. 2, 2020

(30) Foreign Application Priority Data

Dec. 26, 2018  (CN) .......................... 2018 1 1598571

(51) Int. Cl.
| H01L 27/14 | (2006.01) |
| H01L 27/146 | (2006.01) |
| H01L 21/768 | (2006.01) |
| H01L 49/02 | (2006.01) |

(52) U.S. Cl.
CPC .... *H01L 27/14609* (2013.01); *H01L 21/7687* (2013.01); *H01L 27/14636* (2013.01); *H01L 27/14643* (2013.01); *H01L 27/14689* (2013.01); *H01L 28/75* (2013.01)

(58) Field of Classification Search
CPC ....... H01L 28/75; H01L 27/14; H01L 27/146; H01L 27/146; H01L 27/14609; H01L 27/1463; H01L 27/14636; H01L 27/1464; H01L 27/14643; H01L 27/1468;
(Continued)

(56) References Cited

U.S. PATENT DOCUMENTS

| 7,491,990 B2 | 2/2009 | Park |
| 2015/0076500 A1* | 3/2015 | Sakaida ............ H01L 27/14612 257/59 |

(Continued)

*Primary Examiner* — Monica D Harrison
(74) *Attorney, Agent, or Firm* — Winston Hsu

(57) ABSTRACT

An integrated circuit device includes a complementary metal oxide semiconductor (CMOS) image sensor. The complementary metal oxide semiconductor (CMOS) image sensor includes a P-N junction photodiode, a transistor gate, a polysilicon plug and a stacked metal layer. The P-N junction photodiode is disposed in a substrate. The transistor gate and the polysilicon plug are disposed on the substrate, wherein the polysilicon plug is directly connected to the P-N junction photodiode. The stacked metal layer connects the polysilicon plug to the transistor gate, wherein the stacked metal layer includes a lower metal layer and an upper metal layer, and the lower metal layer includes a first metal silicide part contacting to the polysilicon plug. The present invention also provides a method of fabricating said integrated circuit device.

20 Claims, 12 Drawing Sheets

(58) Field of Classification Search
CPC . H01L 27/14689; H01L 21/76; H01L 21/768; H01L 21/7687
USPC .......................................................... 257/292
See application file for complete search history.

(56) References Cited

U.S. PATENT DOCUMENTS

2016/0079297 A1    3/2016  Sato
2016/0172500 A1*  6/2016  Yamazaki ........... H01L 29/7869
                                                                                                                            257/43

* cited by examiner ized Circuit device and method of fabricating integrated circuit

BACKGROUND OF THE INVENTION

1. Field of the Invention

The present invention relates generally to an integrated circuit device and a method of fabricating integrated circuit, and more specifically to an integrated circuit device including a complementary metal oxide semiconductor (CMOS) image sensor and a metal-insulating-metal (MIM) capacitor and a fabricating method thereof.

2. Description of the Prior Art

Semiconductor devices are widely used in a variety of electronic devices such as personal computers, cell phones, digital cameras, and other electronic equipment. The semiconductor device is fabricated by sequentially depositing an insulator layer, a dielectric layer, a conductive layer and a semiconductor layer on a semiconductor substrate, and then performing a lithography process to pattern these material layers, thus integrated circuit devices can being formed on the semiconductor substrate.

A variety of integrated circuit devices such as image sensors, capacitors or etc are fabricated on a single semiconductor wafer to achieve desired functions. For example, an image sensor is used to convert an optical image into an electronic signal. The image sensor includes an array of photosensitive elements such as photodiodes, wherein the photosensitive element generates an electronic signal according to the intensity of light emitting into the photosensitive element. A corresponding image can be shown on a display or information related to the optical image can be provided by the electronic signal. Furthermore, the operating theory of a capacitor is to set two electrode layers as a top and a bottom electrode plate in a semiconductor die, and an insulating layer separating the two electrode layers from a predetermined distance. As a voltage is applied on the two electrode layers, the capacitor is electrically charged. A metal capacitor constituted by a metal layer—an insulating layer—a metal layer (MIM) is widely used in ultra large scale integration (ULSI) because of its lower resistance, non-obvious parasitic effect, and no bias voltage induced in a depletion layer. Thus, MIM capacitors are widely used as main structures of metal capacitors.

How to integrate various integrated circuit devices on a same semiconductor substrate becomes an important issue in current semiconductor industry.

SUMMARY OF THE INVENTION

The present invention provides an integrated circuit device and a method of fabricating integrated circuit, which forms a complementary metal oxide semiconductor (CMOS) image sensor and a metal-insulating-metal (MIM) capacitor at a same time.

The present invention provides an integrated circuit device including a complementary metal oxide semiconductor (CMOS) image sensor. The complementary metal oxide semiconductor (CMOS) image sensor includes a P-N junction photodiode, a transistor gate, a polysilicon plug and a stacked metal layer. The P-N junction photodiode is disposed in a substrate. The transistor gate and the polysilicon plug are disposed on the substrate, wherein the polysilicon plug is directly connected to the P-N junction photodiode. The stacked metal layer connects the polysilicon plug to the transistor gate, wherein the stacked metal layer includes a lower metal layer and an upper metal layer, and the lower metal layer includes a first metal silicide part contacting to the polysilicon plug.

The present invention provides a method of fabricating an integrated circuit including a complementary metal oxide semiconductor (CMOS) image sensor and a metal-insulating-metal (MIM) capacitor, including the following steps. A substrate having an image sensor area and a capacitor area is provided, wherein a P-N junction photodiode is in the substrate of the image sensor area. A first dielectric layer is formed on the substrate, and a polysilicon plug and a transistor gate are formed in the first dielectric layer, wherein the polysilicon plug contacts to the P-N junction photodiode and the transistor gate is disposed in the image sensor area. A first metal layer is deposited and patterned on the first dielectric layer to form a stacked metal layer in the image sensor area, and a bottom electrode in the capacitor area, wherein the stacked metal layer contacts to the polysilicon plug and the transistor gate by opposite two ends, thereby constituting the complementary metal oxide semiconductor (CMOS) image sensor. An insulator and a top electrode are formed on the bottom electrode to form the metal-insulating-metal (MIM) capacitor.

According to the above, the present invention provides an integrated circuit device and a method of fabricating integrated circuit. The integrated circuit includes a complementary metal oxide semiconductor (CMOS) image sensor and a metal-insulating-metal (MIM) capacitor, and the present invention integrates a complementary metal oxide semiconductor (CMOS) image sensor process into a metal-insulating-metal (MIM) capacitor process. More precisely, a first dielectric layer is formed on a substrate, and a polysilicon plug and a transistor gate are formed in the first dielectric layer of an image sensor area; a first metal layer is deposited and patterned on the first dielectric layer to form a stacked metal layer in the image sensor area, and a bottom electrode in a capacitor area, wherein the stacked metal layer contacts to the polysilicon plug and the transistor gate by opposite two ends, thereby constituting the complementary metal oxide semiconductor (CMOS) image sensor; and, an insulator and a top electrode are formed on the bottom electrode to form the metal-insulating-metal (MIM) capacitor. In this way, the stacked metal layer of the complementary metal oxide semiconductor (CMOS) image sensor and the bottom electrode of the metal-insulating-metal (MIM) capacitor share one same metal layer and are formed by same processes. This integrates and simplifies processes, and reduces processing costs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
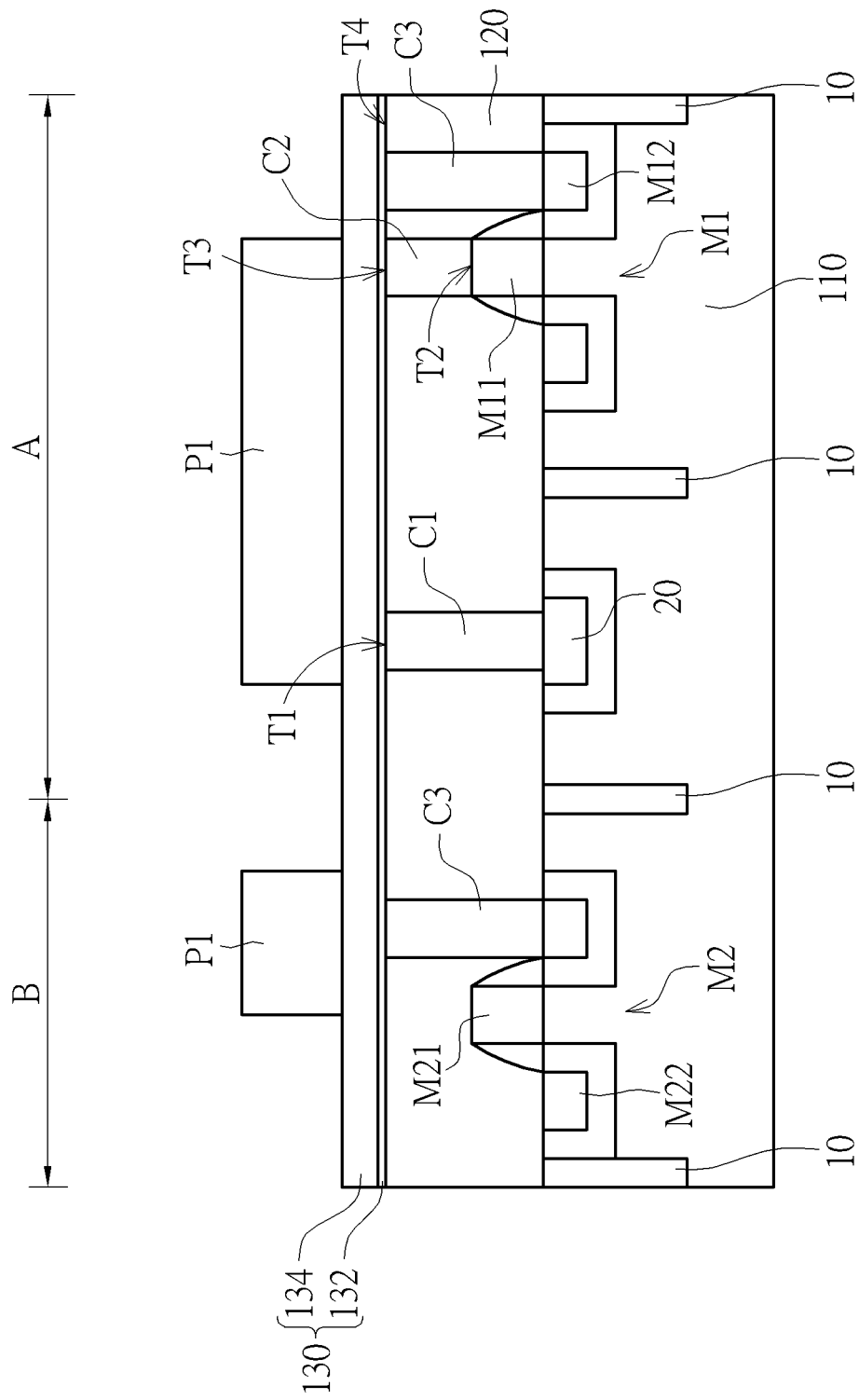
FIG. 1 schematically depicts a cross-sectional view of a method of fabricating an integrated circuit according to an embodiment of the present invention.

FIGS. 1-9 schematically depict cross-sectional views of a method of fabricating an integrated circuit according to an embodiment of the present invention. As shown in FIG. 1, a substrate 110 is provided, wherein the substrate 110 includes an image sensor area A and a capacitor area B. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Isolation structures 10 are disposed in the substrate 110, wherein the isolation structures 10 may be shallow trench isolation (STI) structures, which is formed by a shallow trench isolation (STI) process, but it is not limited thereto. A P-N junction photodiode 20 is formed in the substrate 110 of the image sensor area A. Methods of forming the P-N junction photodiode 20 may include performing doping processes several times. A transistor M1 is formed in the image sensor area A and a transistor M2 is formed in the capacitor area B, wherein the transistor M1 includes a transistor gate M11 located on the substrate 110 of the image sensor area A and a source/drain M12 located in the substrate 110 beside the transistor gate M11, and the transistor M2 includes a transistor gate M21 located on the substrate 110 of the capacitor area B and a source/drain M22 located in the substrate 110 beside the transistor gate M21. The transistor M1 and the transistor M2 may be formed simultaneously or may be formed respectively. Methods of forming the transistor M1 and the transistor M2 are well known in the art, and are not described herein.

A first dielectric layer 120 is formed to cover the substrate 110, the transistor M1 and the transistor M2, and then a polysilicon plug C1 is formed in the first dielectric layer 120, wherein the polysilicon plug C1 is connected to the P-N junction photodiode 20. The first dielectric layer 120 may be an interlayer dielectric layer, which may be an oxide layer in this case, but the first dielectric layer 120 may be other insulating layers in other cases. Methods of forming the polysilicon plug C1 in the first dielectric layer 120 may include etching the first dielectric layer 120 to form a contact hole, and then forming the polysilicon plug C1 in the contact hole by processes such as an epitaxial process, but it is not limited thereto.

Preferably, the polysilicon plug C1 and the transistor gate M11 are in a same horizontal level to make above layers easily to be stacked in later processes. The transistor gate M11 may be a polysilicon gate or a metal gate, depending upon practical requirements. In this embodiment, the transistor gate M11 is a polysilicon gate. Since a top surface T1 of the polysilicon plug C1 is higher than a top surface T2 of the transistor gate M11, a plug C2 is selectively formed on the transistor gate M11, and the top surface T1 of the polysilicon plug C1 and a top surface T3 of the plug C2 are coplanar. Hence, flat stacked metal layers can be formed over the polysilicon plug C1 and the plug C2, thus simplifying processes and stabilizing structures. In a preferred embodiment, the polysilicon plug C1 and the plug C2 may be formed by one same process such as an epitaxial process, and the polysilicon plug C1 and the plug C2 may be constituted by polysilicon, but it is not limited thereto. In another embodiment, the top surface T1 of the polysilicon plug C1 and the top surface T2 of the transistor gate M11 may be in a same horizontal level. For example, the transistor gate M11 may be replaced with a metal gate by a metal gate replacement process, so that the top surface T1 of the polysilicon plug C1, the top surface T2 of the transistor gate M11, and a top surface T4 of the first dielectric layer 120 are in a same horizontal level.

First contact plugs C3 are formed in the first dielectric layer 120 to connect the source/drain M12 of the transistor M1 and the source/drain M22 of the transistor M2 respectively. Methods of forming the first contact plugs C3 are well known in the art, and are not described herein. The order of forming the polysilicon plug C1, the plug C2 and the first contact plugs C3 depends upon practical requirements. In this embodiment, the first contact plugs C3 may be metal plugs including barrier layers and metals, and the materials of the first contact plugs C3 are different from the materials of the polysilicon plug C1 and the plug C2, but it is not limited thereto.

Figure 2:
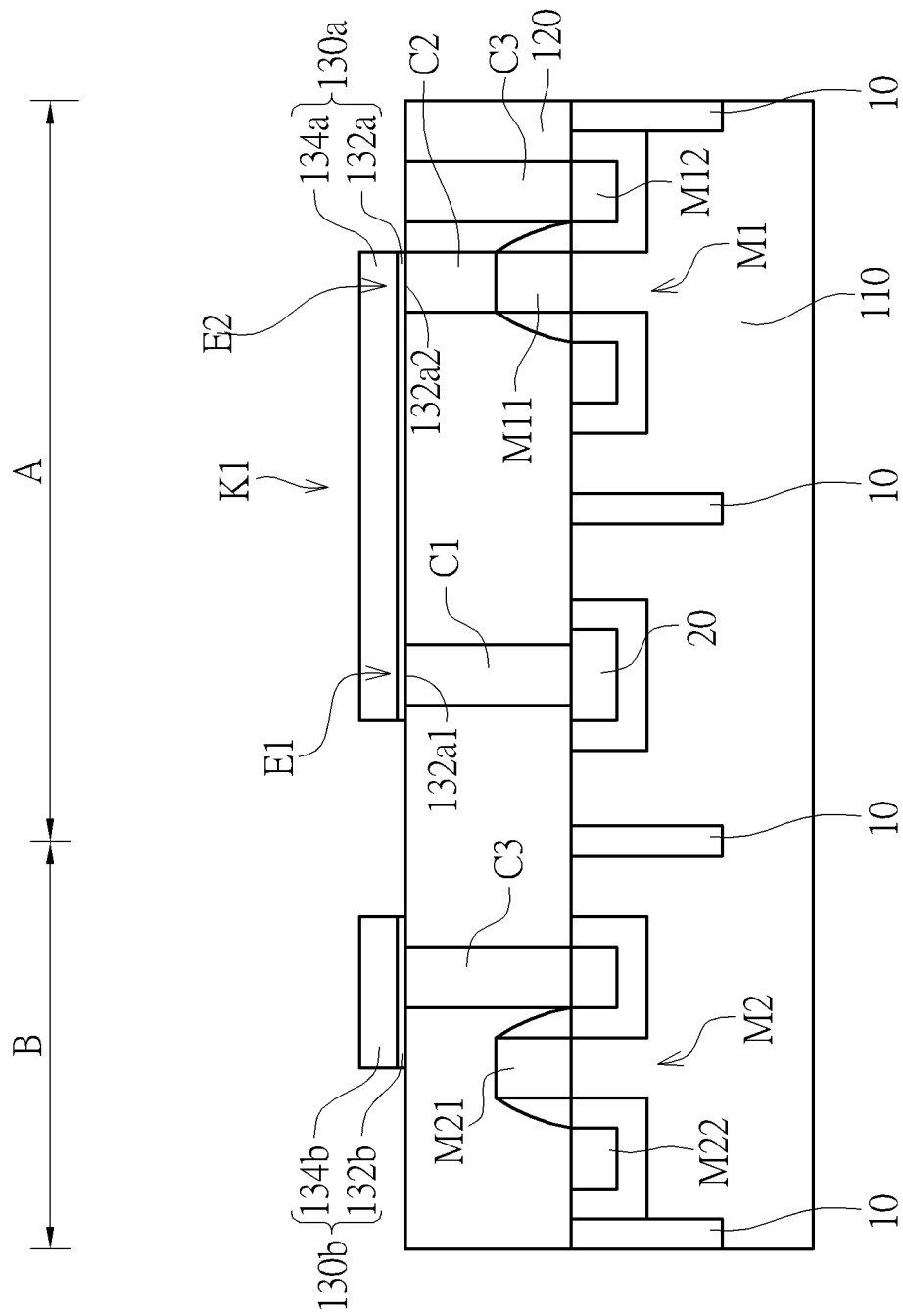
FIG. 2 schematically depicts a cross-sectional view of a method of fabricating an integrated circuit according to an embodiment of the present invention.

A first metal layer 130 is deposited on the first dielectric layer 120. The first metal layer 130 may include a lower metal layer 132 and an upper metal layer 134 stacked from bottom to top, but it is not limited thereto. In another embodiment, the first metal layer 130 may include a plurality of other material layers. The lower metal layer 132 is constituted by metals suitable for forming metal silicides such as titanium, copper or nickel etc, and the upper metal layer 134 is constituted by metals suitable for forming on the lower metal layer 132. In this case, the lower metal layer 132 is a titanium (Ti) layer while the upper metal layer 134 is a titanium nitride (TiN) layer, but it is not limited thereto. The first metal layer 130 is then patterned to form a stacked metal layer 130a in the image sensor area A, and a bottom electrode 130b in the capacitor area B, as shown in FIGS. 1-2. As shown in FIG. 1, a patterned photoresist P1 is formed on the first metal layer 130, and then an exposed part of the first metal layer 130 is removed, to reserve the stacked metal layer 130a and the bottom electrode 130b. Thereafter, the patterned photoresist P1 is removed, as shown in FIG. 2. Thus, the stacked metal layer 130a and the bottom electrode 130b are disposed in a same horizontal level. In this way, the stacked metal layer 130a and the bottom electrode 130b can be formed at the same time, so that processes can be simplified, a complementary metal oxide semiconductor (CMOS) image sensor process can be integrated into a metal-insulating-metal (MIM) capacitor process, and the stacked metal layer 130a and the bottom electrode 130b include common materials.

Since the lower metal layer 132 of the first metal layer 130 is a titanium (Ti) layer and the upper metal layer 134 of the first metal layer 130 is a titanium nitride (TiN) layer, a lower metal layer 132a of the first metal layer 130a and a lower metal layer 132b of the bottom electrode 130b are constituted by a titanium (Ti) layer while an upper metal layer 134a of the stacked metal layer 130a and an upper metal layer 134b of the bottom electrode 130b are constituted by a titanium nitride (TiN) layer. Two ends E1/E2 of the stacked metal layer 130a are connected to the polysilicon plug C1 and the transistor gate M11 respectively. In this case, the end E2 of the stacked metal layer 130a is connected to the transistor gate M11 through the plug C2. That is, the end E1 of the stacked metal layer 130a is connected to the polysilicon plug C1 while the end E2 of the stacked metal layer 130a is connected to the transistor gate M11 through the plug C2, thereby constituting a complementary metal oxide semiconductor (CMOS) image sensor K1.

It is emphasize that, the lower metal layer 132a of the stacked metal layer 130a is connected to the polysilicon plug C1, therefore a part of the lower metal layer 132a contacting to the polysilicon plug C1 can transforming into a first metal silicide part 132a1 by later processes with enough processing temperatures to transform metals to metal silicides. Thus, there is no salicide process being performed in the present invention, and this simplifies processes. In this embodiment, the lower metal layer 132a is a titanium (Ti) layer, and thus the first metal silicide part 132a1 includes titanium silicon (TiSi). In a preferred embodiment, only the part of the lower metal layer 132a contacting the polysilicon plug C1 transforms into the first metal silicide part 132a1. As the plug C2 is a polysilicon plug, a part of the lower metal layer 132a contacting to the plug C2 also transforms into a second metal silicide part 132a2. In this case, the lower metal layer 132a is a titanium (Ti) layer, and thus the second metal silicide part 132a2 includes titanium silicon (TiSi). In a preferred embodiment, only the part of the lower metal layer 132a contacting to the plug C2 transforms into the second metal silicide part 132a2.

Figure 3:
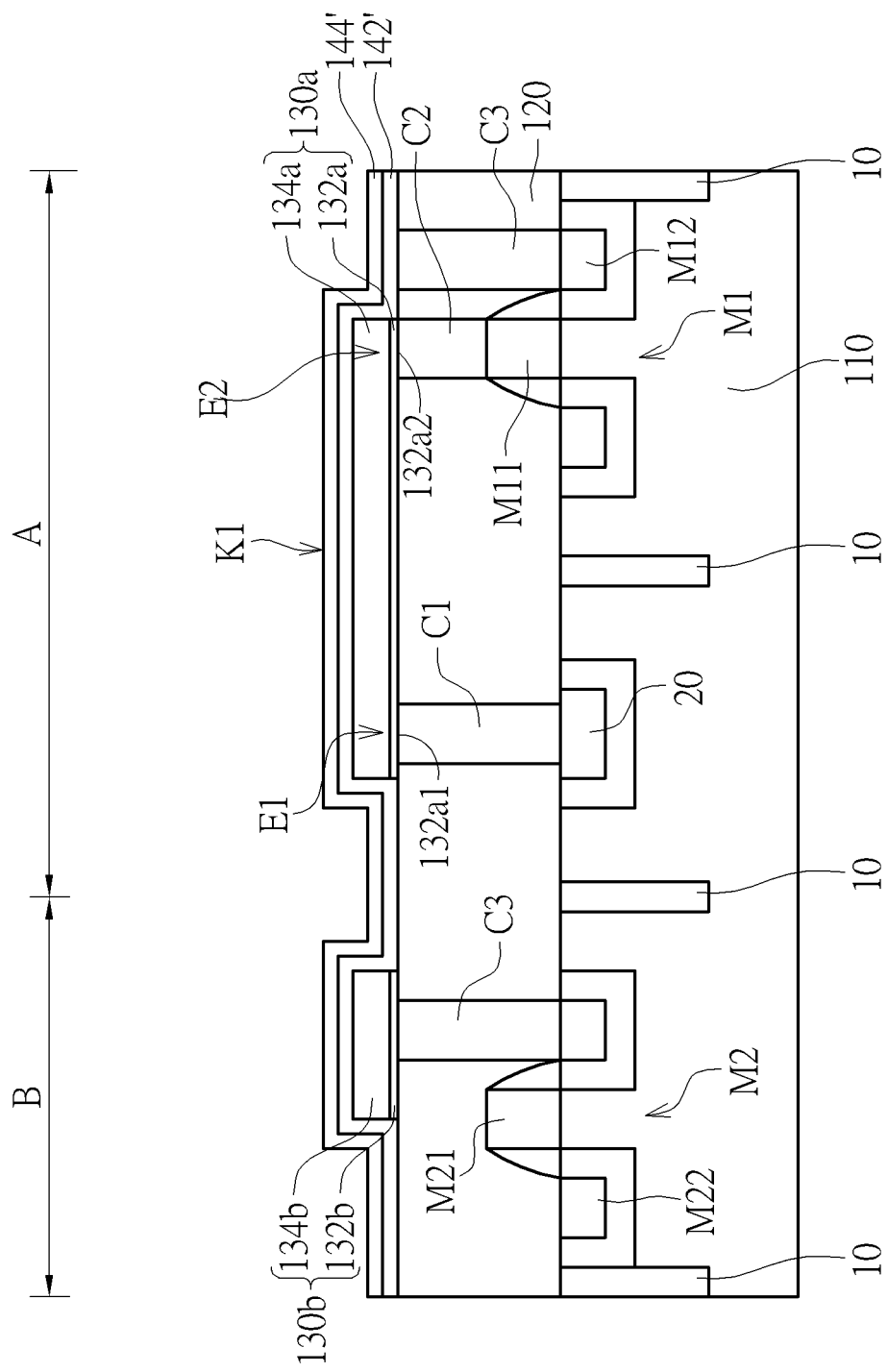
FIG. 3 schematically depicts a cross-sectional view of a method of fabricating an integrated circuit according to an embodiment of the present invention.
Figure 4:
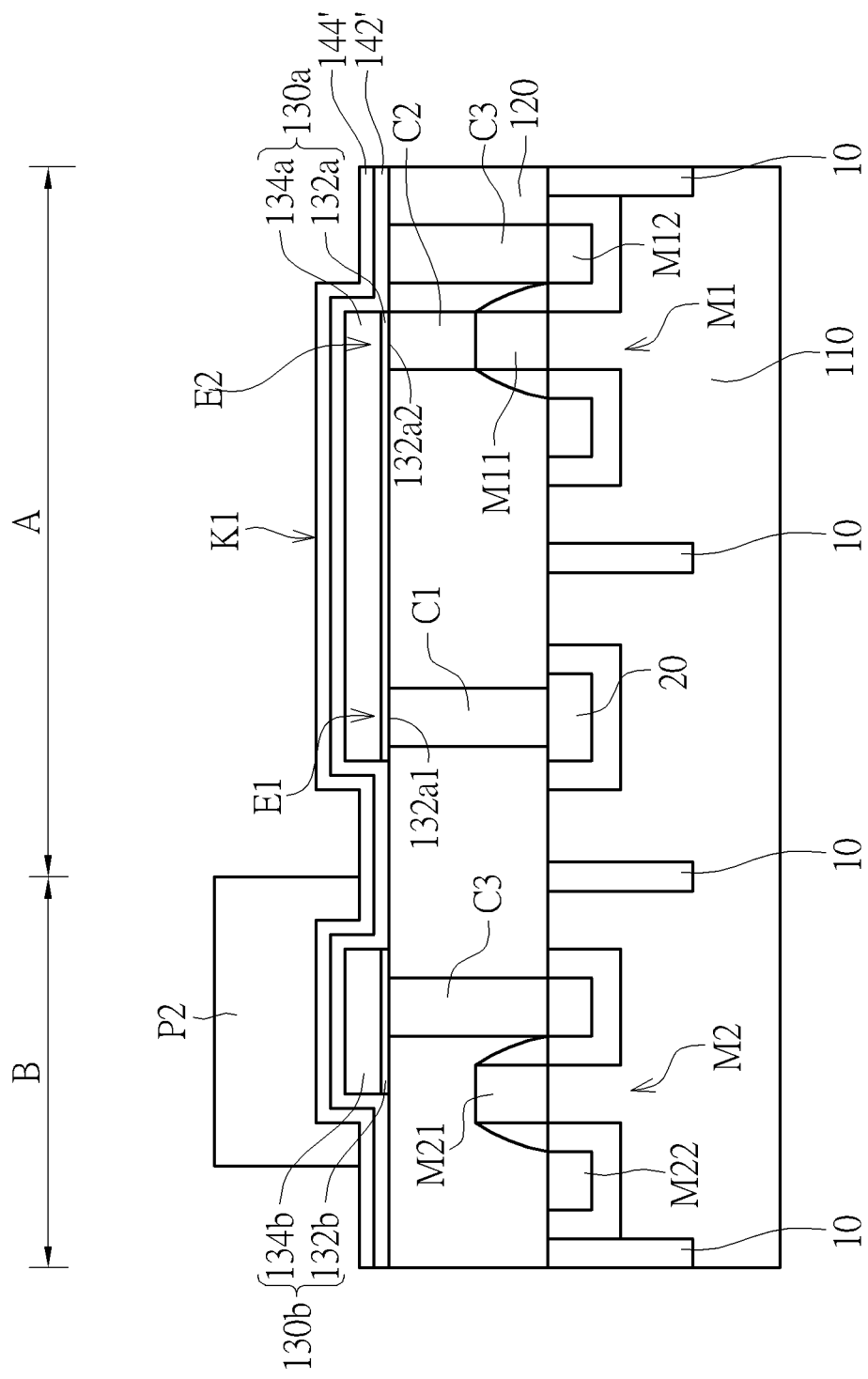
FIG. 4 schematically depicts a cross-sectional view of a method of fabricating an integrated circuit according to an embodiment of the present invention.
Figure 5:
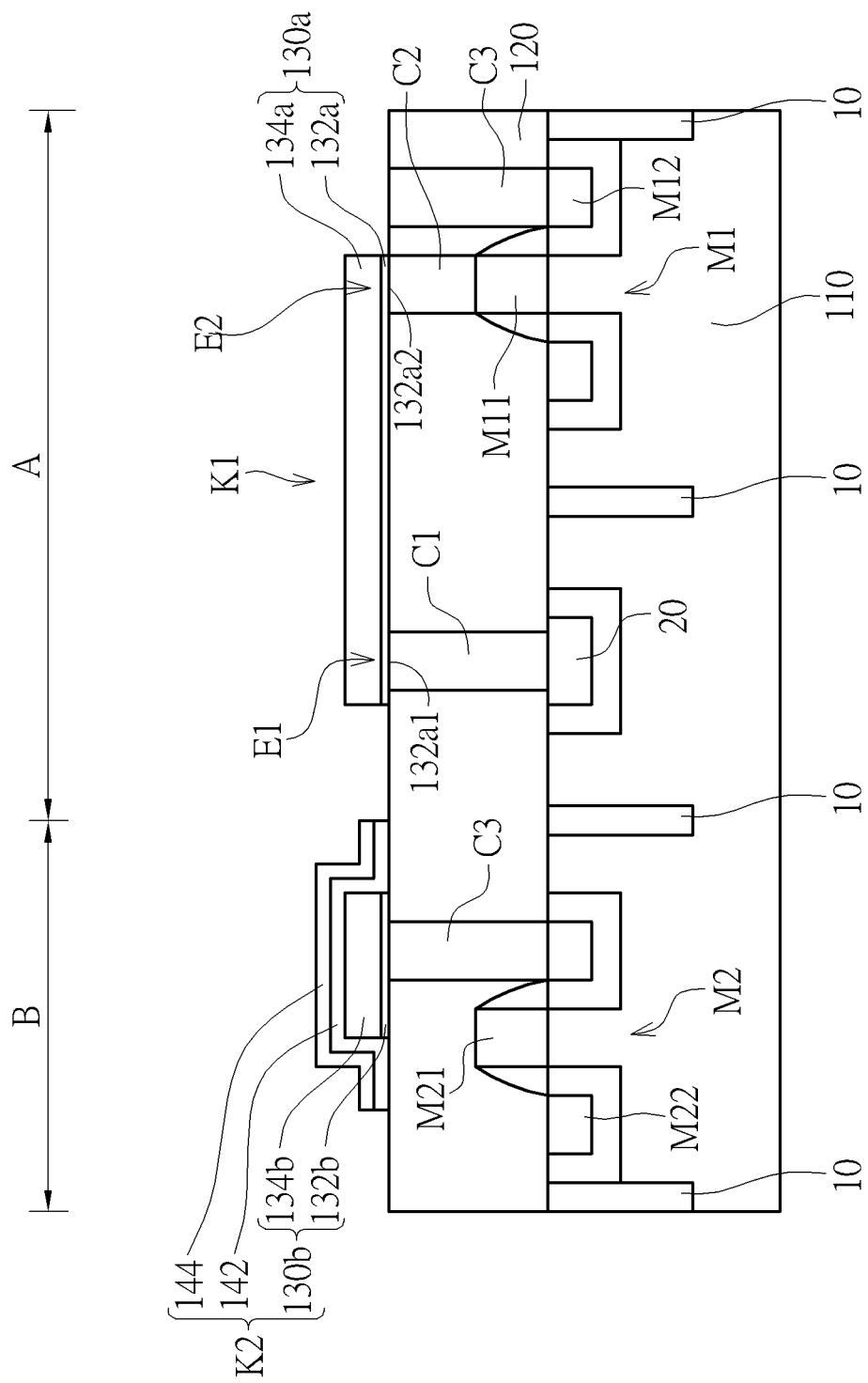
FIG. 5 schematically depicts a cross-sectional view of a method of fabricating an integrated circuit according to an embodiment of the present invention.

Please refer to FIGS. 3-5, an insulator 142 and a top electrode 144 are formed on the bottom electrode 130b, to form a metal-insulating-metal (MIM) capacitor K2. As shown in FIG. 3, an insulator 142' and a second metal layer 144' are sequentially formed to conformally cover the bottom electrode 130b, the stacked metal layer 130a and the first dielectric layer 120. As shown in FIG. 4, a patterned photoresist P2 is formed to cover the insulator 142' and the second metal layer 144'. Exposed parts of the second metal layer 144' and the insulator 142' are removed to form the metal-insulating-metal (MIM) capacitor K2, wherein the metal-insulating-metal (MIM) capacitor K2 includes the bottom electrode 130b, the insulator 142 and the top electrode 144, and then the patterned photoresist P2 is removed, as shown in FIG. 5. In this way, the metal-insulating-metal (MIM) capacitor K2 and the stacked metal layer 130a are disposed in a same horizontal level, so that the aspect ratio of a formed device can be reduced. In this embodiment, the second metal layer 144' and the insulator 142' contacting to the stacked metal layer 130a are removed completely, to form plugs directly on the stacked metal layer 130a in later processes.

Figure 6:
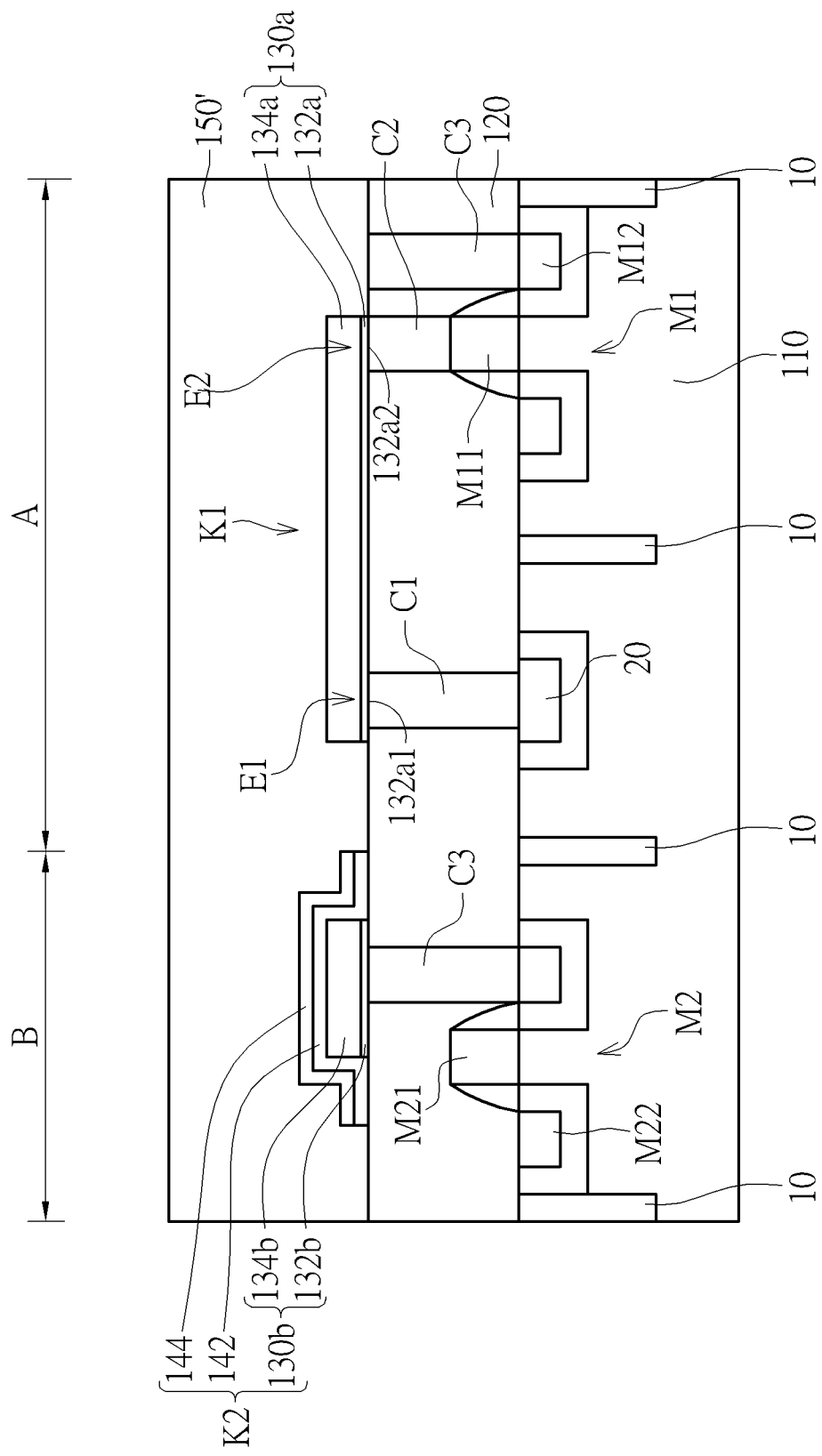
FIG. 6 schematically depicts a cross-sectional view of a method of fabricating an integrated circuit according to an embodiment of the present invention.

As shown in FIG. 6, a second dielectric layer 150' is formed to cover the complementary metal oxide semiconductor (CMOS) image sensor K1, the metal-insulating-metal (MIM) capacitor K2 and the first dielectric layer 120. The second dielectric layer 150' may be an oxide layer in this embodiment, but the second dielectric layer 150' may be other insulators in other embodiments. In this case, the first dielectric layer 120 and the second dielectric layer 150' may include common material layers.

Figure 7:
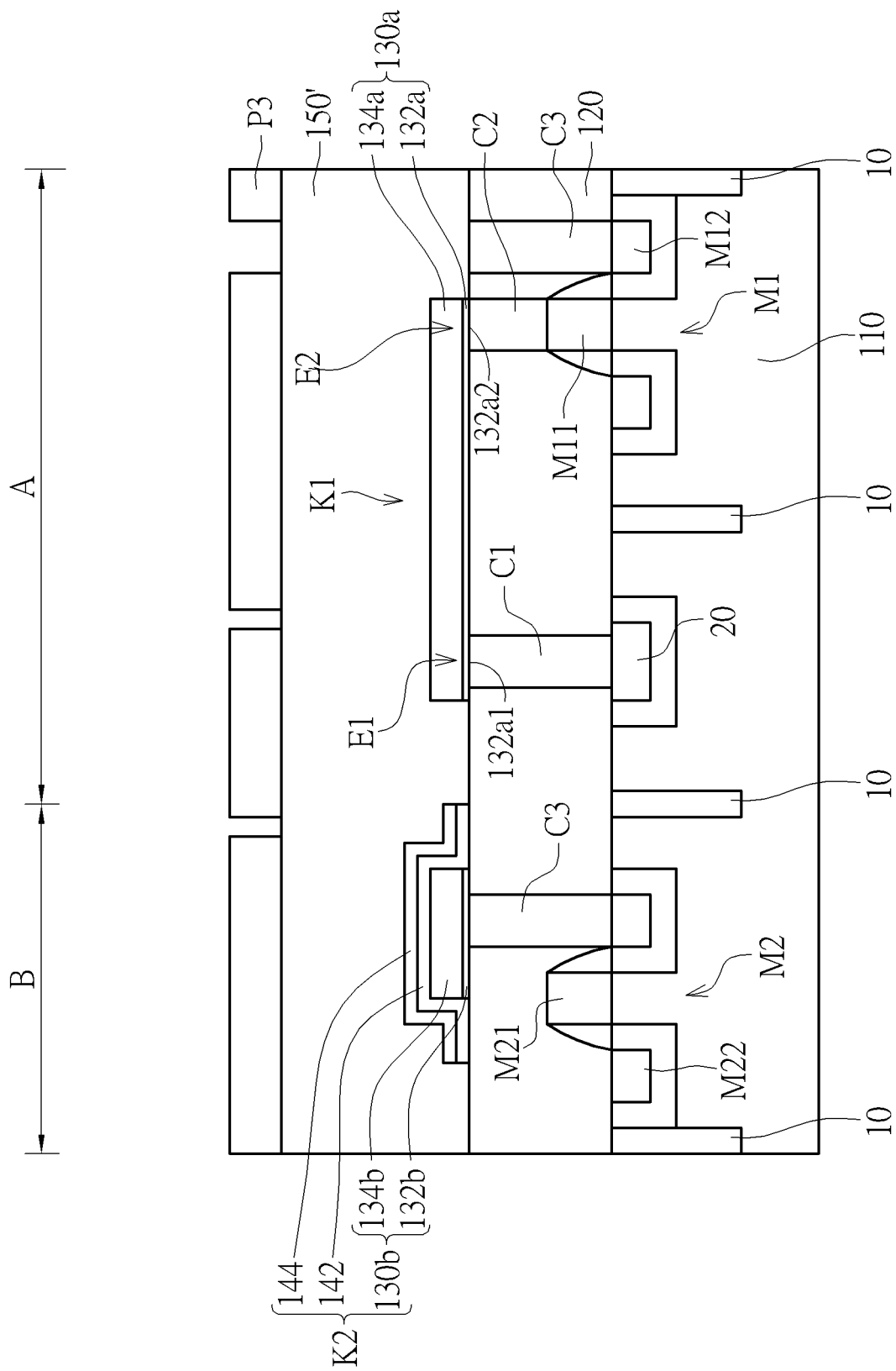
FIG. 7 schematically depicts a cross-sectional view of a method of fabricating an integrated circuit according to an embodiment of the present invention.
Figure 8:
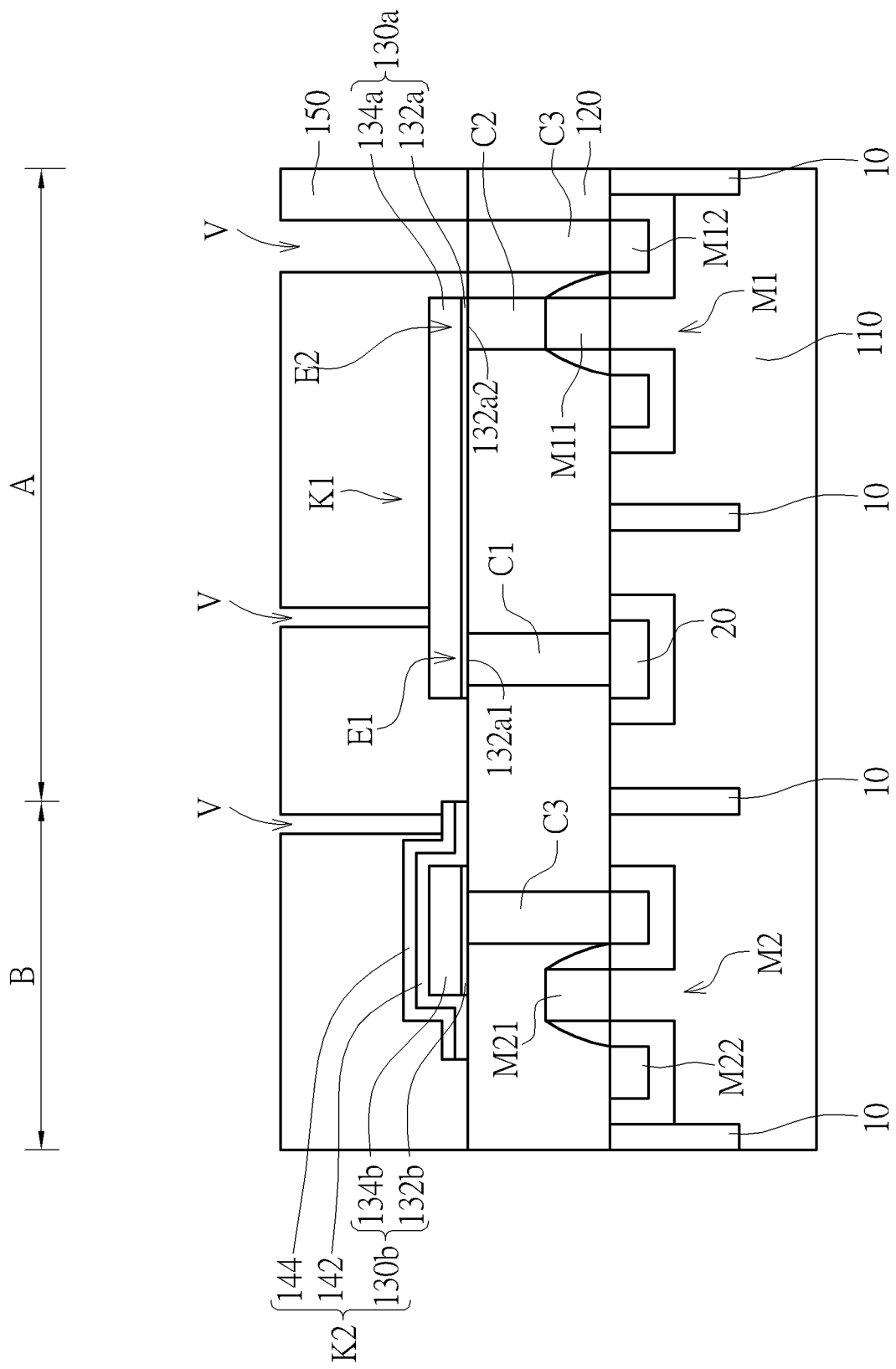
FIG. 8 schematically depicts a cross-sectional view of a method of fabricating an integrated circuit according to an embodiment of the present invention.
Figure 9:
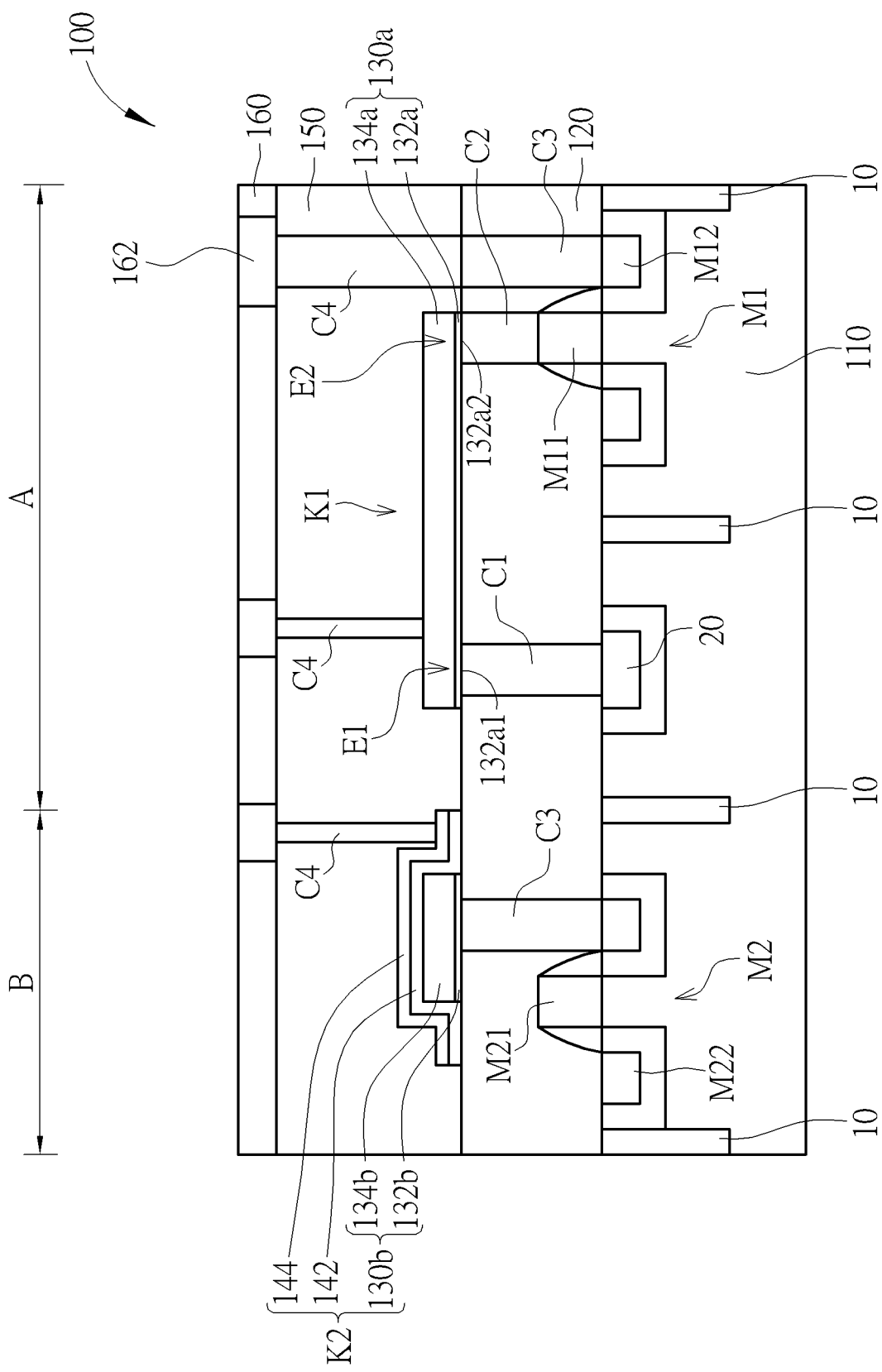
FIG. 9 schematically depicts a cross-sectional view of a method of fabricating an integrated circuit according to an embodiment of the present invention.

As shown in FIGS. 7-9, after the metal-insulating-metal (MIM) capacitor K2 is formed, second contact plugs C4 are formed on the top electrode 144 and the stacked metal layer 130a to connect the top electrode 144 and the stacked metal layer 130a to a metal interconnect 162 of a third dielectric layer 160. In this case, one of the second contact plugs C4 is connected to the first contact plug C3, and this first contact plug C3 is connected to the source/drain M12 of the transistor M1. As shown in FIG. 7, a patterned photoresist P3 is formed on the second dielectric layer 150' and areas for forming second contact plugs are exposed. As shown in FIG. 8, the exposed part of the second dielectric layer 150' is etched to form contact holes V in a second dielectric layer 150, and then the patterned photoresist P3 is removed. As shown in FIG. 9, metals fill into the contact holes V to form the second contact plugs C4. Thereafter, the third dielectric layer 160 is formed by depositing and patterning, and the metal interconnect 162 fills into the third dielectric layer 160.

By using the above method, an integrated circuit device 100 including the complementary metal oxide semiconductor (CMOS) image sensor K1 and the metal-insulating-metal (MIM) capacitor K2 is formed. The complementary metal oxide semiconductor (CMOS) image sensor K1 may include the P-N junction photodiode 20, the transistor gate M1, the polysilicon plug C1 and the stacked metal layer 130a. The P-N junction photodiode 20 is disposed in the substrate 110. The transistor gate M1 and the polysilicon plug 20 are disposed on the substrate 110, and the polysilicon plug C1 directly contacts to the P-N junction photodiode 20. The polysilicon plug C1 is connected to the transistor gate M1 by the stacked metal layer 130a. The stacked metal layer 130a may include the lower metal layer 132a and the upper metal layer 134a, wherein the lower metal layer 132a includes the first metal silicide part 132a1 contacting the polysilicon plug C1, and the second metal silicide part 132a2 contacting the plug C2 on the transistor gate M1. The metal-insulating-metal (MIM) capacitor K2 may include the insulator 142 sandwiched by the bottom electrode 130b and the top electrode 144. In this case, the bottom electrode 130b and the stacked metal layer 130a are formed at the same time, include common material layers and are in a same horizontal level.

Figure 10:
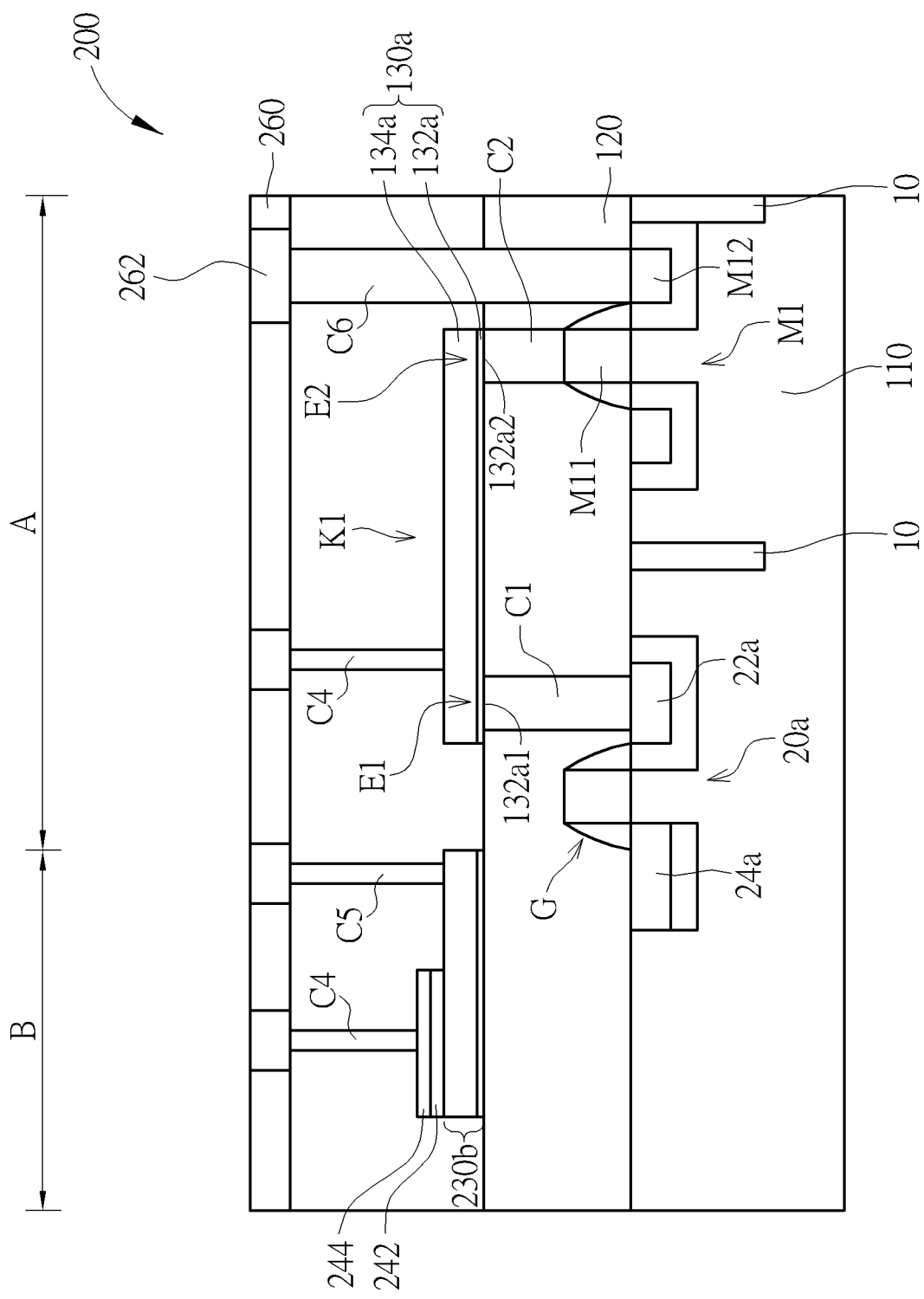
FIG. 10 schematically depicts a cross-sectional view of an integrated circuit device according to another embodiment of the present invention.

Moreover, another similar structure is presented as follows. FIG. 10 schematically depicts a cross-sectional view of an integrated circuit device according to another embodiment of the present invention. As shown in FIG. 10, the P-N junction photodiode 20 of FIG. 9 is replaced by an embedded photodiode 20a. The embedded photodiode 20a may include a transmission gate G located on the substrate 110, a floating diffusion region 22a connecting to the polysilicon plug C1, and a P-N junction region 24a at a side of the transmission gate G opposite to the floating diffusion region 22a. The first contact plug C3 in the capacitor area B of FIG. 9 is replaced by a third contact plug C5, and the third contact plug C5 is disposed on a bottom electrode 230b protruding from a top electrode 244 and an insulator 242, so that the bottom electrode 230b is connected to a metal interconnect 262 in a third dielectric layer 260. The first contact plug C3 connected to the source/drain M12 of the transistor M1 and the second contact plug C4 connected to the first contact plug C3 of FIG. 9 are replaced by one single second contact plug C6. By doing this, the second contact plugs C4, the second contact plug C6 and the third contact plug C5 can be formed at the same time and are connected to the metal interconnect 262. Methods of forming an integrated circuit device 200 are similar to the methods of forming the integrated circuit device 100 of FIG. 9, and are not described again.

Figure 11:
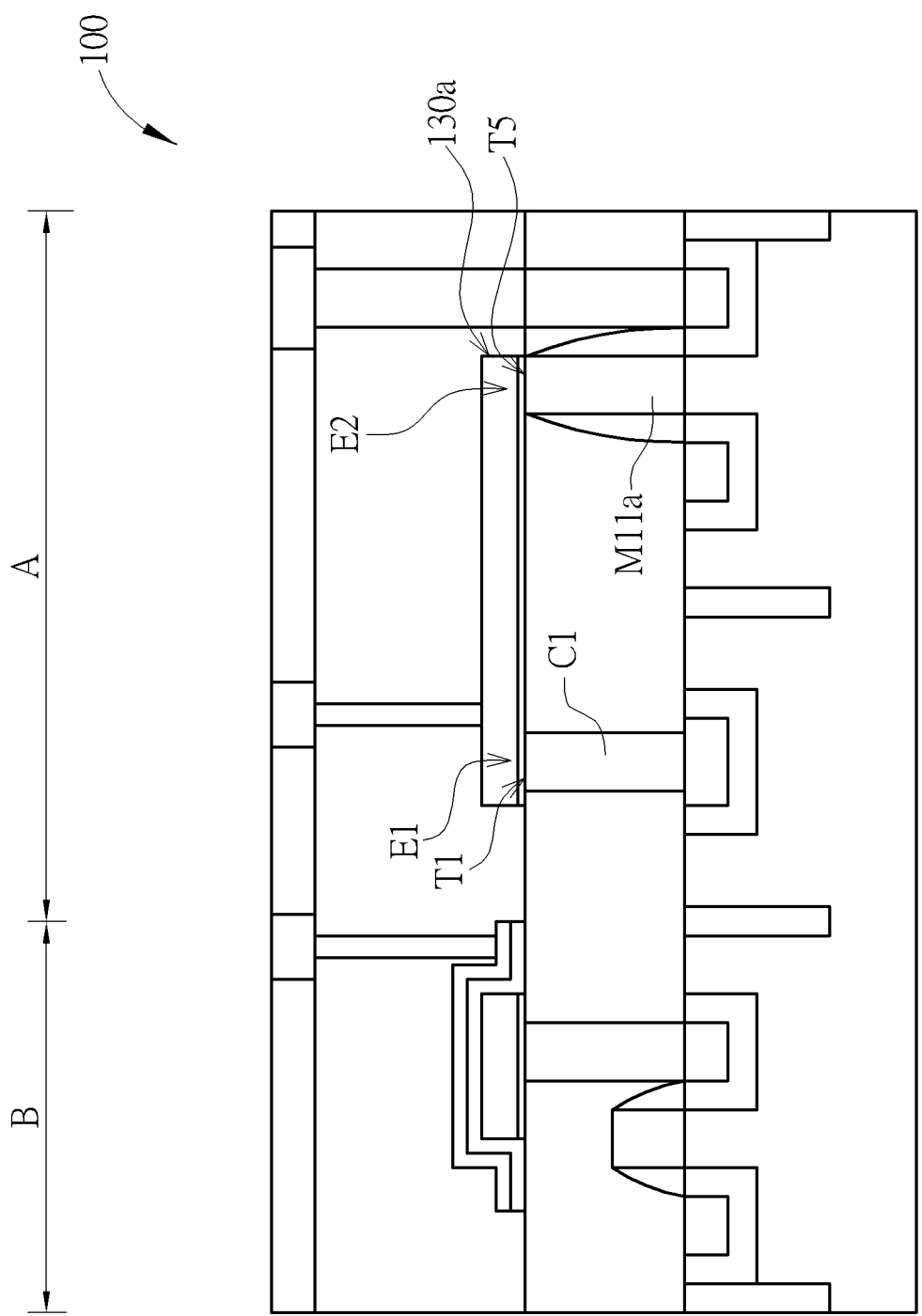
FIG. 11 schematically depicts a cross-sectional view of an integrated circuit device according to another embodiment of the present invention.

FIG. 11 schematically depicts a cross-sectional view of an integrated circuit device according to another embodiment of the present invention. As shown in FIG. 11, the transistor gate M11 of FIG. 9 is replaced by a transistor gate M11a, wherein the top surface T1 of the polysilicon plug C1 is trimmed with a top surface T5 of the transistor gate M11a. Thereby, there is no plug C2 of FIG. 9 being formed, and the two ends E1/E2 of the stacked metal layer 130a are directly connected to the polysilicon plug C1 and the transistor gate M11a.

Figure 12:
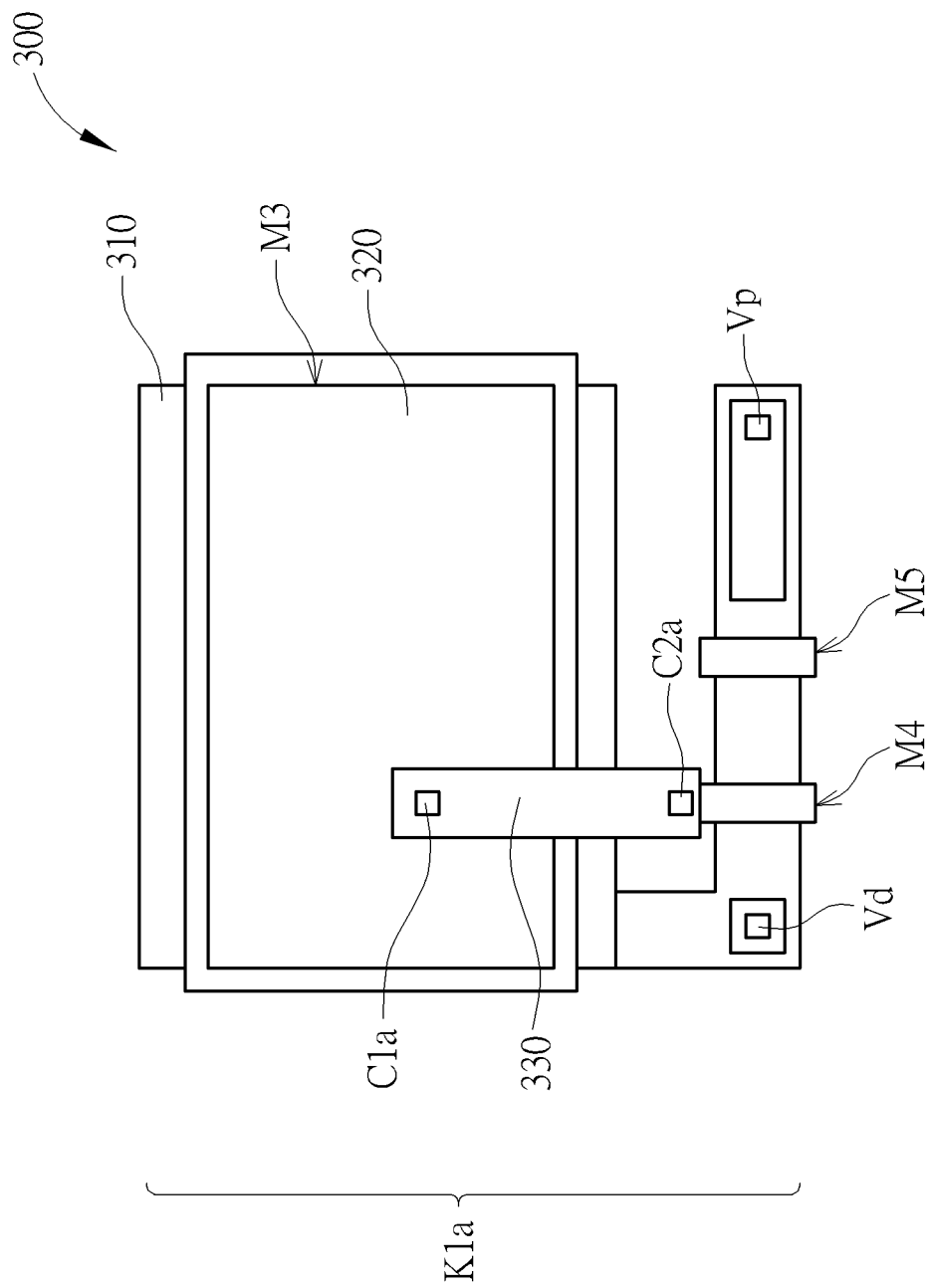
FIG. 12 schematically depicts a top view of an integrated circuit device according to an embodiment of the present invention.

FIG. 12 schematically depicts a top view of an integrated circuit device according to an embodiment of the present invention. As shown in FIG. 12, an integrated circuit layout 300 may include an active area 310. A P-N junction photodiode 320 is disposed in the active area 310, and a reset transistor M3 is disposed on the P-N junction photodiode 320. The P-N junction photodiode 320 is electrically connected to a stacked metal layer 330 through a polysilicon plug C1a, and the stacked metal layer 330 is electrically connected to a transistor M4 through a plug C2a. An applied voltage note Vd is connected to the active area 310. Thereby, a complementary metal oxide semiconductor (CMOS) image sensor K1a is formed. The complementary metal oxide semiconductor (CMOS) image sensor K1a is connected to an output note Vp through a row selective transistor M5.

To summarize, the present invention provides an integrated circuit device and a method of fabricating integrated circuit. The integrated circuit includes a complementary metal oxide semiconductor (CMOS) image sensor and a metal-insulating-metal (MIM) capacitor, and the present invention integrates a complementary metal oxide semiconductor (CMOS) image sensor process into a metal-insulating-metal (MIM) capacitor process. More precisely, a first dielectric layer is formed on a substrate, and a polysilicon plug and a transistor gate are formed in the first dielectric layer of an image sensor area; a first metal layer is deposited and patterned on the first dielectric layer to form a stacked metal layer in the image sensor area, and a bottom electrode in the capacitor area, wherein the stacked metal layer contacts the polysilicon plug and the transistor gate by opposite two ends, thereby constituting the complementary metal oxide semiconductor (CMOS) image sensor; and, an insulator and a top electrode are formed on the bottom electrode to form the metal-insulating-metal (MIM) capacitor. In this way, the stacked metal layer of the complementary metal oxide semiconductor (CMOS) image sensor and the bottom electrode of the metal-insulating-metal (MIM) capacitor share one same metal layer, include common materials and are formed by same processes.

The part of the stacked metal layer contacting to the polysilicon plug can transform into a first metal silicide part by later processes having processing temperatures that can transforming metals into metal silicides. Thus, extra salicide process is not performed, and this simplifies processes. Furthermore, the complementary metal oxide semiconductor (CMOS) image sensor and the metal-insulating-metal (MIM) capacitor are in a same horizontal level, and thereby reducing the aspect ratio of a formed device. Second contact plugs can be formed on the top electrode and the stacked metal layer at the same time, to connect the top electrode and the stacked metal layer to a metal interconnect. This integrates and simplifies processes, and therefore reduces processing costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit device, comprising:
   a complementary metal oxide semiconductor (CMOS) image sensor, comprising:
      a P-N junction photodiode disposed in a substrate;
      a transistor gate and a polysilicon plug disposed on the substrate, wherein the polysilicon plug is directly connected to the P-N junction photodiode; and
      a stacked metal layer connecting the polysilicon plug to the transistor gate, wherein the stacked metal layer comprises a lower metal layer and an upper metal layer, and the lower metal layer comprises a first metal silicide part contacting to the polysilicon plug.

2. The integrated circuit device according to claim 1, wherein the whole first metal silicide part contacts the polysilicon plug.

3. The integrated circuit device according to claim 1, wherein the transistor gate comprises a polysilicon gate or a metal gate.

4. The integrated circuit device according to claim 3, wherein the lower metal layer comprises a second metal silicide part contacting to the polysilicon gate.

5. The integrated circuit device according to claim 1, wherein the lower metal layer comprises a titanium (Ti) layer, the upper metal layer comprises a titanium nitride (TiN) layer, and the first metal silicide part comprises titanium silicon (TiSi).

6. The integrated circuit device according to claim 1, wherein the transistor gate and the polysilicon plug are disposed in a same horizontal level.

7. The integrated circuit device according to claim 6, further comprising:
   a plug disposed on the transistor gate, so that a top surface of the polysilicon plug and a top surface of the plug are coplanar.

8. The integrated circuit device according to claim 1, wherein the integrated circuit device comprises a metal-insulating-metal (MIM) capacitor disposed on the substrate.

9. The integrated circuit device according to claim 8, wherein the metal-insulating-metal (MIM) capacitor and the stacked metal layer are disposed in a same horizontal level.

10. The integrated circuit device according to claim 8, wherein the metal-insulating-metal (MIM) capacitor comprises an insulator sandwiched by a bottom electrode and a top electrode, wherein the bottom electrode and the stacked metal layer comprise common materials.

11. The integrated circuit device according to claim 10, wherein the bottom electrode and the stacked metal layer are disposed in a same horizontal level.

12. The integrated circuit device according to claim 10, further comprising:
   a first contact plug disposed between the bottom electrode and the substrate.

13. The integrated circuit device according to claim 10, further comprising:
   second contact plugs disposed on the top electrode and the stacked metal layer respectively to connect the top electrode and the stacked metal layer to a metal interconnect.

14. The integrated circuit device according to claim 13, further comprising:
   a third contact plug disposed on the bottom electrode protruding from the top electrode to connect the bottom electrode to the metal interconnect.

15. A method of fabricating an integrated circuit comprising a complementary metal oxide semiconductor (CMOS) image sensor and a metal-insulating-metal (MIM) capacitor, comprising:
   providing a substrate having an image sensor area and a capacitor area, wherein a P-N junction photodiode is disposed in the substrate of the image sensor area;
   forming a first dielectric layer on the substrate, and a polysilicon plug and a transistor gate in the first dielectric layer, wherein the polysilicon plug contacts to the P-N junction photodiode and the transistor gate is disposed in the image sensor area;
   depositing and patterning a first metal layer on the first dielectric layer to form a stacked metal layer in the image sensor area, and a bottom electrode in the capacitor area, wherein the stacked metal layer contacts to the polysilicon plug and the transistor gate by opposite two ends, thereby constituting the complementary metal oxide semiconductor (CMOS) image sensor; and
   forming an insulator and a top electrode on the bottom electrode to form the metal-insulating-metal (MIM) capacitor.

16. The method of fabricating an integrated circuit according to claim 15, wherein the stacked metal layer and the bottom electrode are formed at a same time.

17. The method of fabricating an integrated circuit according to claim 16, wherein the stacked metal layer and the bottom electrode both comprise a titanium (Ti) layer and a titanium nitride (TiN) layer stacked from bottom to top.

18. The method of fabricating an integrated circuit according to claim 15, wherein the step of forming the insulator and the top electrode on the bottom electrode comprises:
   sequentially forming an insulating layer and a second metal layer to conformally cover the bottom electrode and the stacked metal layer; and
   removing parts of the second metal layer and the insulating layer to form the insulator and the top electrode.

19. The method of fabricating an integrated circuit according to claim 18, wherein parts of the second metal layer and the insulating layer contacting the stacked metal layer are removed completely.

20. The method of fabricating an integrated circuit according to claim 15, further comprising:
   forming second contact plugs on the top electrode and the stacked metal layer at the same time to contact the top electrode and the stacked metal layer to a metal interconnect after the metal-insulating-metal (MIM) capacitor is formed.

* * * * *